(12) United States Patent
Park et al.

(10) Patent No.: US 11,591,711 B2
(45) Date of Patent: Feb. 28, 2023

(54) METHOD AND SYSTEM FOR PRODUCING SILICON CARBIDE INGOT

(71) Applicant: SENIC INC., Cheonan-si (KR)

(72) Inventors: Jong Hwi Park, Suwon-si (KR); Eun Su Yang, Suwon-si (KR); Byung Kyu Jang, Suwon-si (KR); Jung Woo Choi, Suwon-si (KR); Sang Ki Ko, Suwon-si (KR); Kap-Ryeol Ku, Suwon-si (KR); Jung-Gyu Kim, Suwon-si (KR)

(73) Assignee: SENIC INC., Cheonan-si (KR)

( * ) Notice: Subject to any disclaimer, the term of this patent is extended or adjusted under 35 U.S.C. 154(b) by 183 days.

(21) Appl. No.: 17/088,104

(22) Filed: Nov. 3, 2020

(65) Prior Publication Data
US 2021/0317593 A1     Oct. 14, 2021

(30) Foreign Application Priority Data

Apr. 9, 2020     (KR) .................. 10-2020-0043399

(51) Int. Cl.
C30B 1/12        (2006.01)
C30B 29/36       (2006.01)
C30B 33/00       (2006.01)

(52) U.S. Cl.
CPC ............. C30B 1/12 (2013.01); C30B 29/36 (2013.01); C30B 33/005 (2013.01)

(58) Field of Classification Search
CPC ......... C30B 1/12; C30B 29/36; C30B 33/005; C30B 23/06; C30B 23/066
See application file for complete search history.

(56) References Cited

U.S. PATENT DOCUMENTS

| | | |
|---|---|---|
| 6,780,243 B1 | 8/2004 | Wang et al. |
| 10,294,584 B2 | 5/2019 | Gupta et al. |
| 2017/0137962 A1 | 5/2017 | Ma et al. |

FOREIGN PATENT DOCUMENTS

| | | | |
|---|---|---|---|
| CN | 105051268 A | | 11/2015 |
| CN | 107208310 A | | 9/2017 |
| CN | 109666970 A | | 4/2019 |
| CN | 110578171 A | | 12/2019 |
| EP | 2019001119 | * | 1/2019 |
| JP | 2001-114599 A | | 4/2001 |
| JP | 2003-4298 A | | 1/2003 |
| JP | 2014-201498 A | | 10/2014 |
| JP | 2014-201508 A | | 10/2014 |
| JP | 2015071527 | * | 4/2015 |

(Continued)

OTHER PUBLICATIONS

Taiwanese International Search Report dated Apr. 9, 2020 in counterpart Taiwanese Application No. 109129291 (1 page in Taiwanese).

*Primary Examiner* — Robert M Kunemund
(74) *Attorney, Agent, or Firm* — NSIP Law

(57) ABSTRACT

A silicon carbide ingot producing method is provided. The method produces a silicon carbide ingot in which an internal space of a reactor is depressurized and heated to create a predetermined difference in temperature between upper and lower portions of the internal space. The method produces a silicon carbide ingot in which a plane of a seed crystal corresponding to the rear surface of the silicon carbide ingot is lost minimally. Additionally, the method produces a silicon carbide ingot with few defects and good crystal quality.

11 Claims, 5 Drawing Sheets

(56) References Cited

FOREIGN PATENT DOCUMENTS

| | | | |
|---|---|---|---|
| JP | 2015182948 | * | 10/2015 |
| JP | 2015-224169 | A | 12/2015 |
| KR | 10-2006-0040733 | A | 5/2006 |
| KR | 10-2006-0095268 | A | 8/2006 |
| KR | 10-2009-0109325 | A | 10/2009 |
| KR | 10-1003075 | B1 | 12/2010 |
| KR | 20110006701 | * | 1/2011 |
| KR | 10-2012-0130030 | A | 11/2012 |
| KR | 10-2013-0013710 | A | 2/2013 |
| KR | 10-1619610 | B1 | 5/2016 |
| KR | 10-2017-0072441 | A | 6/2017 |
| KR | 10-1760030 | B1 | 8/2017 |
| KR | 10-2017-0135218 | A | 12/2017 |
| KR | 10-2068933 | B1 | 1/2020 |

* cited by examiner

Silicon Carbide Ingot with Losses

Silicon Carbide Ingot with Losses

METHOD AND SYSTEM FOR PRODUCING SILICON CARBIDE INGOT

CROSS-REFERENCE TO RELATED APPLICATION

This application claims the benefit under 35 USC § 119(a) of Korean Patent Application No. 10-2020-0043399, filed on Apr. 9, 2020, in the Korean Intellectual Property Office, the entire disclosure of which is incorporated herein by reference for all purposes.

BACKGROUND

1. Field

The following description relates to a method and system for producing a silicon carbide ingot.

2. Description of Related Art

Silicon carbide has high heat resistance and mechanical strength and is physically and chemically stable. Due to these advantages, silicon carbide has recently been utilized as a semiconductor material. Recently, there has been an increased demand for single-crystal silicon carbide substrates for high-power devices, etc.

Single-crystal silicon carbide may be prepared by various processes such as liquid phase epitaxy (LPE), chemical vapor deposition (CVD), and physical vapor transport (PVT). According to physical vapor transport, silicon carbide as a raw material is loaded into a crucible, a seed crystal composed of single-crystal silicon carbide is arranged at the top end of the crucible, the crucible is heated by induction to sublimate the raw material, and as a result, single-crystal silicon carbide is grown on the seed crystal.

Physical vapor transport enables fast growth of single-crystal silicon carbide to produce silicon carbide ingots. Accordingly, physical vapor transport is most widely used for the production of silicon carbide ingots. However, physical vapor transport has the disadvantage that when a crucible is heated by induction, the internal temperature distribution of the crucible may vary depending on various factors such as initial growth conditions and different temperatures in the upper and lower portions of the crucible, which may deteriorate the quality of the rear surface of a final silicon carbide ingot.

Thus, the internal temperature of a crucible during growth and pre-growth should be taken into account to improve the quality of the rear surface of a final ingot and to ensure the reproducibility of the ingot.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a silicon carbide ingot producing method includes arranging a raw material and a silicon carbide seed crystal to face each other in a reactor having an internal space; performing a growth operation by controlling a temperature, a pressure, and an atmosphere of the internal space to sublimate the raw material, and grow a silicon carbide ingot from the silicon carbide seed crystal; and cooling the reactor, and recovering the silicon carbide ingot, wherein a heat insulating material surrounds an outer surface of the reactor, a heating device is configured to control the temperature of the internal space; wherein the growth operation comprises a first growth process in which the temperature of the internal space increases from a pre-growth onset temperature to a development temperature, and a second growth process in which the development temperature is maintained to produce the silicon carbide ingot, and wherein the internal space is depressurized at the pre-growth onset temperature, the growth of the silicon carbide ingot is induced at the development temperature after completion of the depressurization of the internal space, a difference in temperature between an upper portion and a lower portion of the internal space at the pre-growth onset temperature is 40° C. to 60° C., the silicon carbide seed crystal is located in the upper portion of the internal space, and the raw material is located in the lower portion of the internal space.

The method may include depressurizing the internal space in the atmosphere; and injecting an inert gas into the depressurized internal space, followed by performing a heating operation to the pre-growth onset temperature, prior to the growth operation.

A heating rate in the first growth process may be lower than an average heating rate in the heating operation and the first growth process.

The heating device may be configured to move in an upward direction and a downward direction from the reactor, and induce a difference in temperature between the upper portion and the lower portion of the internal space in the growth operation.

The pre-growth onset temperature in the lower portion of the internal space may be 1500° C. to 1700° C.

The development temperature in the lower portion of the internal space in the growth step may be 2100° C. to 2500° C.

A temperature difference at the development temperature may be greater by 70° C. to 120° C. than a temperature difference at the pre-growth onset temperature.

A temperature difference at the development temperature in the first growth process may be 110° C. to 160° C.

The internal space may be depressurized to 1 torr to 50 torr in the first growth process.

The silicon carbide seed crystal may include 4H silicon carbide of 4 inches or more.

A heating rate in the first growth process may be 1° C./min to 5° C./min.

A recovery in the cooling operation may be performed by cutting a rear surface of the silicon carbide ingot in contact with the silicon carbide seed crystal, and 5% or less of the entire area of the rear surface of the recovered silicon carbide ingot is lost after heating at a rate of 5° C./min from room temperature to 900° C. and oxidation heat treatment at 900° C. for 10 hours.

In a general aspect, a silicon carbide ingot producing system includes a reactor having an internal space; a heat insulating material surrounding an outer surface of the reactor; and a heating device configured to control a temperature of the internal space, wherein a silicon carbide seed crystal is located in an upper portion of the internal space, a raw material is located in a lower portion of the internal space; wherein the heating device is configured to move in an upward direction and a downward direction from the reactor to control a difference in temperature between the upper portion of the internal space and the lower portion of the internal space; and wherein 5% or less of the entire area of a rear surface of the silicon carbide ingot in contact with the silicon carbide seed crystal is lost after heating at a rate of 5° C./min from room temperature to 900° C. and oxidation heat treatment at 900° C. for 10 hours.

The internal space may be depressurized at a pre-growth onset temperature, a growth of the silicon carbide ingot may be induced at a development temperature after completion of a depressurization of the internal space, and a difference in temperature between the upper portion of the internal space and the lower portion of the internal space induced by the heating device may be 40° C. to 60° C. at the pre-growth onset temperature.

A silicon carbide ingot whose rear surface in contact with a silicon carbide seed crystal is lost by 5% or less of its entire area after heating at a rate of 5° C./min from room temperature to 900° C. and oxidation heat treatment at 900° C. for 10 hours.

In a general aspect, a silicon carbide ingot producing method includes disposing a raw material to face a silicon carbide seed crystal in an internal space of a reactor; applying a heat insulating material to an outer surface of the reactor; increasing a temperature of the internal space from a first temperature to a second temperature; and maintaining the temperature of the internal space at the second temperature, and producing the silicon carbide ingot at the second temperature; wherein a difference in temperature between an upper portion of the internal space and a lower portion of the internal space at the first temperature is 40° C. to 60° C.

The silicon carbide seed crystal may be located at an upper portion of the internal space, and the raw material is located at a lower portion of the internal space.

The reactor may be a graphite crucible.

The internal space may be depressurized at the first temperature, and a growth of the silicon carbide ingot may be induced at the second temperature after completion of the depressurization.

The first temperature may be a temperature at which the raw material begins to sublimate, and the second temperature may be a temperature at which sublimation occurs.

Other features and aspects will be apparent from the following detailed description, the drawings, and the claims.

Figure 1:
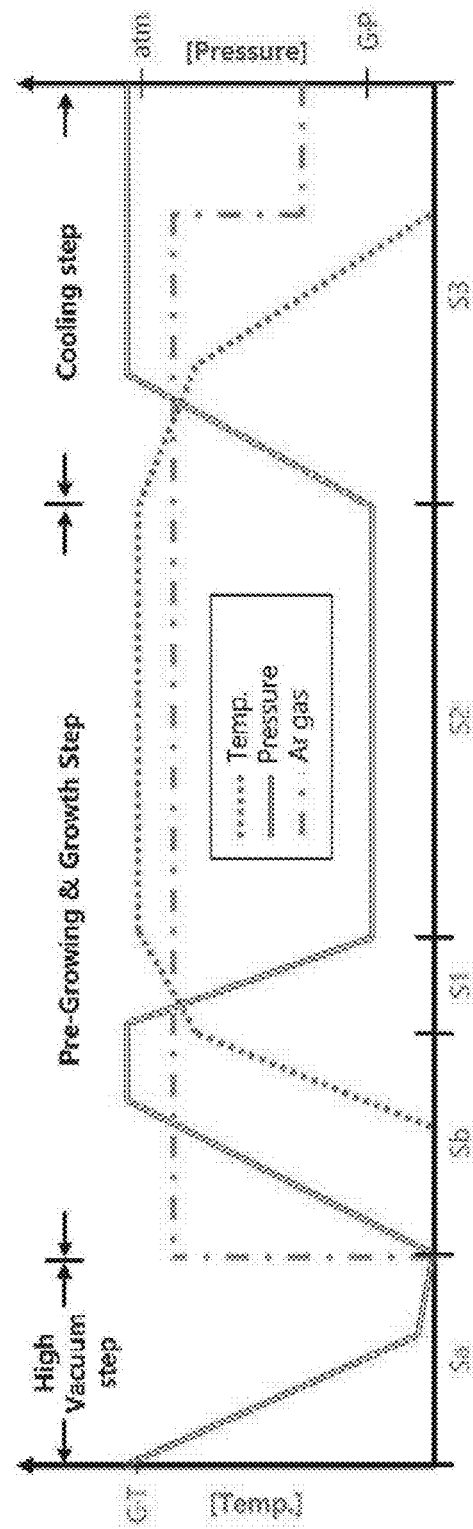
FIG. 1 illustrates variations in temperature, pressure, and argon gas pressure versus time in a method for producing a silicon carbide ingot, in accordance with one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

The following examples relate to a method that minimizes a loss of the rear surface of a silicon carbide ingot, and improves the quality of the silicon carbide ingot. The examples also relate to a method for producing a silicon carbide ingot by inducing a difference in temperature between upper and lower portions of a reactor during pre-growth and gradually increasing the temperature difference.

Method for Producing Silicon Carbide Ingot

Figure 3:
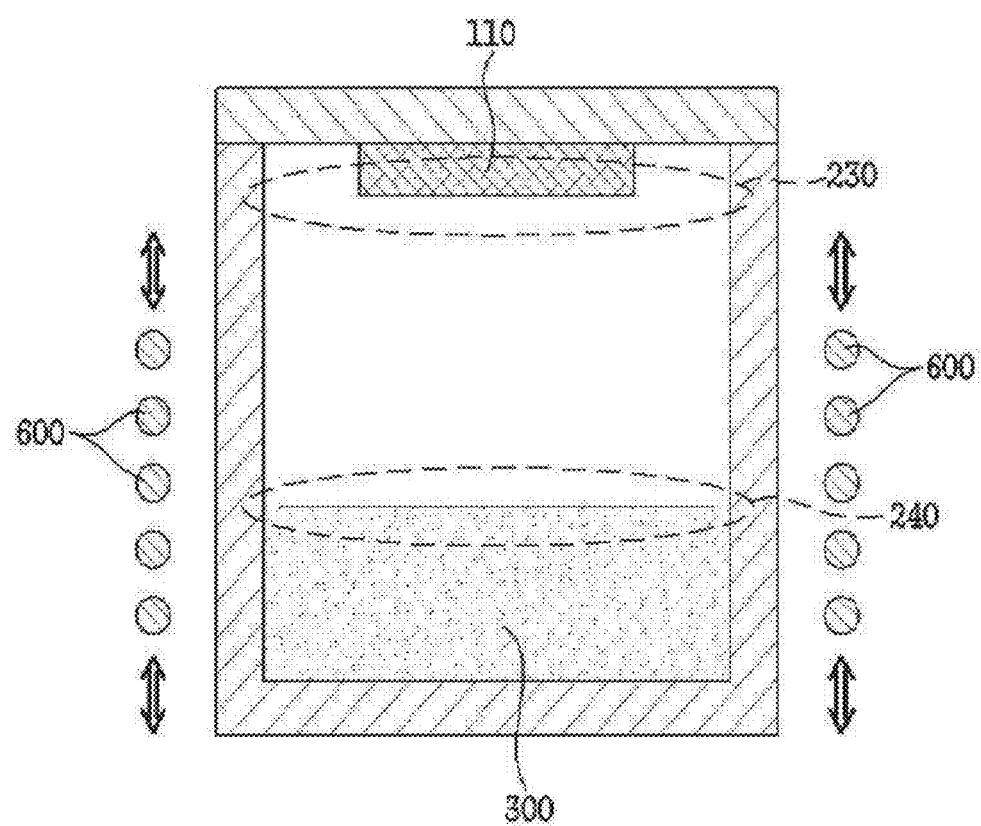
FIG. 3 illustrates an example system for producing a silicon carbide ingot, in accordance with one or more embodiments.
Figure 4:
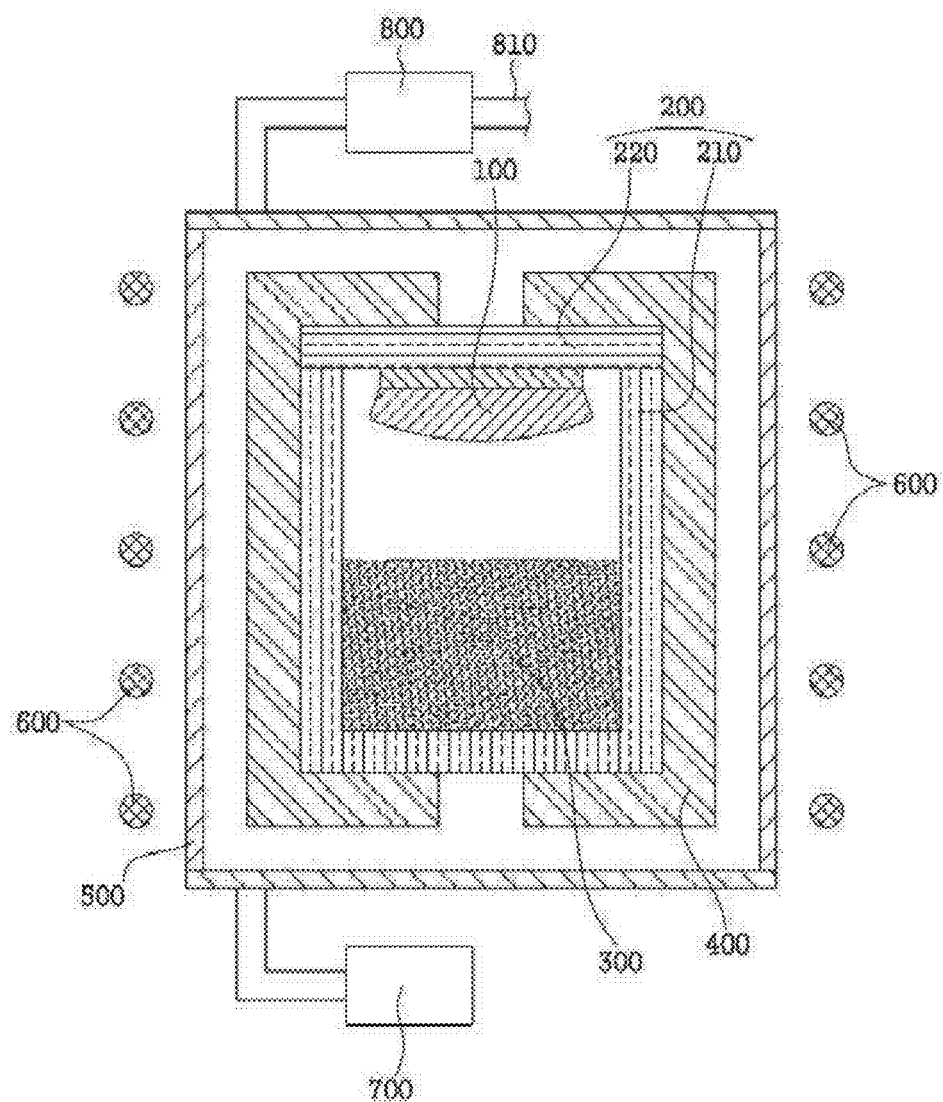
FIG. 4 illustrates an example system for producing a silicon carbide ingot, in accordance with one or more embodiments.

Referring to FIGS. 3 and 4, in one aspect, a method for producing a silicon carbide ingot according to an example includes arranging a raw material 300 and a silicon carbide seed crystal to face each other in a reactor 200 having an internal space (a preparation operation); controlling the temperature, pressure, and atmosphere of the internal space to sublimate the raw material and grow a silicon carbide ingot 100 from the seed crystal (a growth operation); and cooling the reactor and recovering the silicon carbide ingot (a cooling operation), wherein a heat insulating material surrounds the outer surface of the reactor, one or more heating devices may control the temperature of the reactor or the internal space. The growth operation may include a first growth process in which the temperature of the internal space increases from a pre-growth onset temperature to a development temperature and a second growth process in which the development temperature is maintained to produce the silicon carbide ingot, the internal space begins to be depressurized at the pre-growth onset temperature, the growth of the silicon carbide ingot is induced at the development temperature after completion of the depressurization of the internal space, the difference in temperature between upper and lower portions of the internal space at the pre-growth onset temperature is 40° C. to 60° C., the silicon carbide seed crystal may be located in the upper portion 230 of the internal space, and the raw material is located in the lower portion 240 of the internal space.

An example system for producing a silicon carbide ingot is illustrated in FIGS. 3 and 4. Referring to FIGS. 3 and 4, a description will be given of the method for producing a silicon carbide ingot, in accordance with one or more embodiments.

In a preparation operation, a raw material 300 and a silicon carbide seed crystal 110 are arranged to face each other in a reactor 200 having an internal space.

The size of the silicon carbide seed crystal 110 may vary depending on the size of a desired wafer and C-plane (000-1) of the silicon carbide seed crystal 110 may be directed toward the raw material 300.

The silicon carbide seed crystal 110 may include 4H silicon carbide of 4 inches or more.

In a non-limited example, the raw material 300 may be in the form of a powder including a carbon source and a silicon source. The raw material 300 may be a necked or surface carbonized silicon carbide powder.

The reactor 200 may be a container where a reaction for the growth of the silicon carbide ingot occurs. The reactor 200 may be a graphite crucible but is not limited thereto. In an example, the reactor 200 may include a body 210 having an internal space and an opening, and a cover 220 corresponding to the opening to define the internal space. The cover of the crucible may further include a seed crystal holder that is integrated with, or separated from, the cover 220. The silicon carbide seed crystal 110 can be fixed by the seed crystal holder to face the raw material 300.

The reactor 200 is surrounded and fixed by a heat insulating material 400. The heat insulating material 400 surrounding the reactor is located in a reaction chamber 500 such as, but not limited to, a quartz tube. The internal temperature of the reactor 200 may be controlled by the heating device 600 provided outside the heat insulating material 400.

The heat insulating material 400 may have a porosity in the range of 72% to 95%, 75% to 93% or 80% to 91%. The use of the heat insulating material 400 whose porosity is in the range defined above may reduce the formation of cracks in the grown silicon carbide ingot.

The heat insulating material 400 may have a compressive strength of 0.2 MPa or more, 0.48 MPa or more, or 0.8 MPa or more. The compressive strength of the heat insulating material may be 3 MPa or less, or 2.5 MPa or less. When the compressive strength of the heat insulating material is in the range defined above, good thermal/mechanical stability of the silicon carbide ingot is ensured and the probability of ash occurrence is lowered, achieving high quality of the silicon carbide ingot.

The heat insulating material 400 may include a carbonaceous felt, specifically a graphite felt. The carbonaceous felt may be a rayon- or pitch-based graphite felt.

A vacuum exhauster 700 may be in communication with the reaction chamber 500 to control the degree of vacuum in the reaction chamber 500. A line 810, through which a gas is injected into the reaction chamber 500, may also be in communication with the reaction chamber 500. A mass flow controller 800 may be provided in the line 810 to control the gas injection. By utilizing these elements, the flow rates of an inert gas may be controlled in the subsequent growth and cooling operations.

The growth operation may be carried out by heating the reactor 200 and the internal space of the reactor 200 with the heating device 600. Simultaneously with, or separately from, the heating, the internal space may be depressurized to control the degree of vacuum, and an inert gas may be injected to induce the growth of the silicon carbide ingot.

The heating device 600 may be provided to be moveable in upward and downward directions from the reactor 200. Thus, the location of the reactor 200 relative to the heating device 600 may be changed, and a difference in temperature between the upper and lower portions of the internal space may be created. Specifically, a temperature difference may be created between the seed crystal 110 located in the upper portion 230 of the internal space, and the raw material 300 located in the lower portion 240 of the internal space.

In an example, the heating device 600 may be a helical coil disposed along the outer circumference of the reactor 200 or the heat insulating material 400 surrounding the reactor.

Referring to FIG. 1, the growth step may include a first growth process S1 in which the temperature of the internal space increases from a pre-growth onset temperature to a development temperature, and a second growth process S2 for substantial growth in which the development temperature is maintained.

The method may further include the operations of: depressurizing the internal space in the atmosphere (a depressurization operation Sa); and injecting an inert gas into the depressurized internal space, followed by heating to the pre-growth onset temperature (a heating operation Sb), prior to the growth step.

The temperature may be raised to the pre-growth onset temperature at a rate of 3° C./min to 13° C./min or 5° C./min to 11° C./min. The temperature may be raised to the pre-growth onset temperature at a rate of 7° C./min to 10° C./min.

In the depressurization operation Sa, the pressure of the internal space may be reduced to 10 torr or less or 5 torr or less.

The heating operation Sb may be carried out by injecting an inert gas such as argon or nitrogen such that the pressure of the internal space is 500 torr or 800 torr and heating at a rate of 1° C./min to 10° C./min such that the temperature in the lower portion of the internal space is 1500° C. to 1700° C.

Referring to FIG. 4, the upper portion 230 of the internal space is a region of the internal space that is close to the surface of the silicon carbide seed crystal 110 or the ingot, and the lower portion 240 of the internal space is a region of the internal space that is close to the surface of the raw material 300. Specifically, the temperature in the upper portion 230 of the internal space is measured at a location distant at least about 5 mm, more specifically about 5 mm, below the surface of the silicon carbide seed crystal 110 or the ingot and the temperature in the lower portion 240 of the internal space is measured at a location distant at least about 10 mm, more specifically about 5 mm, above the surface of the raw material 300. Different temperatures may be measured at different points at the same level in the upper or lower portion of the internal space when viewed in the lengthwise of the crucible. In this example, the temperature measured at the center of the upper or lower portion of the internal space is considered as the temperature of the corresponding portion.

The pre-growth onset temperature in the first growth process S1 refers to a temperature at which a portion of the raw material 300 begins to sublimate. As indicated by a dotted line in FIG. 1, the pre-growth onset temperature may be a temperature after the heating operation and before the growth operation. After injection of an inert gas in the heating operation, the internal space may be depressurized at the pre-growth onset temperature. Specifically, the pre-growth onset temperature in the lower portion 240 of the internal space may be 1500° C. to 1700° C. or 1600° C. to 1640° C.

In the first growth process S1, the pre-growth onset temperature in the upper portion 230 of the internal space may be 1450° C. to 1650° C. or 1550° C. to 1587° C.

In the first growth process, the pre-growth onset temperature in the upper portion of the internal space may be different by 40° C. to 60° C. or 50° C. to 55° C. from that in the lower portion of the internal space.

The development temperature in the first growth process S1 refers to a temperature at which substantial sublimation of the raw material 300 occurs. As indicated by a dotted line in FIG. 1, the development temperature increases in the first growth process S1. In the first growth process S1, the internal space is depressurized and the growth of the silicon carbide ingot is induced under the reduced pressure. The growth of the silicon carbide ingot may be induced by varying the pressure within ±10% of the reduced pressure at the development temperature.

In the first growth process S1, the development temperature in the lower portion 240 of the internal space may be 2100° C. to 2500° C. or 2200° C. to 2400° C.

In the first growth process S1, the development temperature in the upper portion 230 of the internal space may be 1900° C. to 2300° C. or 2100° C. to 2250° C.

In the first growth process S1, the development temperature in the upper portion of the internal space may be different by 110° C. to 160° C. or 135° C. to 150° C. from the development temperature in the upper portion of the internal space.

In the first growth process S1, the difference in temperature between the upper and the lower portions of the internal space may increase with increasing temperature of the internal space.

The temperature difference at the development temperature may be greater by 70° C. to 120° C. or 70° C. to 95° C. than that at the pre-growth onset temperature.

Based on the temperature ranges in the upper and lower portions of the internal space, the temperature difference between the upper and lower portions of the internal space, and the temperature difference variation in the first growth process S1, the formation of polymorphs other than the desired crystal in the silicon carbide ingot at the initial stage is minimized and stable growth of the ingot is ensured. If the temperature differences at the pre-growth onset temperature and the development temperature in the first growth process are smaller than the lower limits defined above, there is a high possibility that crystals other than the desired crystal may be incorporated to form polycrystals and there is a risk that the growth rate may decrease. If the temperature differences are larger than the upper limits defined above, the crystal quality may deteriorate.

In the first growth process S1, the temperature of the internal space may be raised from the pre-growth onset temperature to the development temperature, and the pressure of the internal space may be reduced to 1 torr to 50 torr.

The heating rate in the first growth process S1 may be lower than the heating rate in the heating operation, and may be lower than the average heating rate throughout the heating operation and the first growth process.

The heating rate in the first growth process S1 may be in the range of 1° C./min to 5° C./min or 3° C./min to 5° C./min. Within this range, the formation of polymorphs other than the desired crystal may be prevented and stable growth of the ingot can be induced.

The first growth process S1 may proceed such that the lower portion 240 of the reactor 200, particularly the surface of the raw material, is maximally heated by the heating device 600. When the heating device 600 is in the form of a helical coil, the desired temperature difference between the upper and the lower portions of the internal space can be created, for example, by varying the number of turns and the thickness of the coil.

The temperature raised to the development temperature in the first growth process may be maintained in the second growth process S2 where the raw material is substantially sublimated to form the ingot.

The second growth process may be carried out for 5 hours to 180 hours, 30 hours to 160 hours or 50 hours to 150 hours.

The growth operation may be carried out by rotating the reactor 200 around the vertical axis such that the same temperature gradient is maintained.

In the growth operation, a predetermined amount of an inert gas may be supplied to the exterior of the reactor 200. A flow of the inert gas may be created in the internal space of the reactor 200. The inert gas may flow from the raw material 300 in the direction towards the silicon carbide seed crystal 110. Thus, a stable temperature gradient may be established in the reactor 200 and the internal space.

In a non-limiting example, the inert gas may be argon, helium or a mixture thereof.

In the cooling operation S3, the silicon carbide ingot grown in the growth operation may be cooled at a predetermined rate under a flow of an inert gas.

The cooling operation S3 may be carried out at a rate of 1° C./min to 10° C./min or 3° C./min to 9° C./min. The cooling rate may be 5° C./min to 8° C./min.

In the cooling operation S3, the pressure of the internal space of the reactor 200 may be controlled simultaneously when the silicon carbide ingot is cooled. Alternatively, the pressure control may be executed separately from the cooling of the silicon carbide ingot. The pressure of the internal space can be controlled to a maximum of 800 torr.

A predetermined amount of an inert gas may be supplied to the interior of the reactor 200 in the cooling operation S3, similar to the growth operation. The inert gas may be, for example, argon or nitrogen. A flow of the inert gas may be created in the internal space of the reactor 200. The inert gas may flow from the raw material 300 in the direction towards the silicon carbide seed crystal 110.

The cooling operation S3 may include the sun-operations of: pressurizing the internal space of the reactor 200 to, or above atmospheric pressure and cooling the internal space to 1500° C. to 1700° C. (primary cooling) and cooling the internal space to room temperature (secondary cooling).

The recovery in the cooling operation S3 may be performed by cutting the rear surface of the silicon carbide ingot in contact with the silicon carbide seed crystal. 5% or less of the entire area of the rear surface of the recovered silicon carbide ingot in contact with the silicon carbide seed crystal may be lost after heating at a rate of 5° C./min from room temperature to 900° C. and oxidation heat treatment at 900° C. for 10 hours. The heat treatment may be performed in a furnace at ambient atmosphere without the need to use any gas such as oxygen or nitrogen.

That is, the rear surface of the silicon carbide ingot in contact with the seed crystal may be lost minimally. Additionally, the silicon carbide ingot may exhibit improved crystal quality.

System for Producing Silicon Carbide Ingot

Referring to FIGS. 3 and 4, in a further aspect, a system for producing a silicon carbide ingot, in accordance with one or more embodiments, may include a reactor 200 having an internal space, a heat insulating material 400 surrounding the outer surface of the reactor; and heating device 600 which controls the temperature of the reactor 200 or the internal space, wherein a silicon carbide seed crystal 110 is located in an upper portion 230 of the internal space, a raw material 300 is located in a lower portion 240 of the internal space, the heating device may be provided to be moveable in upward and downward directions from the reactor 200 to control the difference in temperature between the upper and lower portions of the internal space, and 5% or less of the entire area of the rear surface of the silicon carbide ingot in contact with the silicon carbide seed crystal may be lost after heating at a rate of 5° C./min from room temperature to 900° C. and oxidation heat treatment at 900° C. for 10 hours. The heat treatment may be performed in a furnace at ambient atmosphere without the need to use any gas such as oxygen or nitrogen.

Referring to FIGS. 3 and 4, the reactor 200 may include a body 210 having an internal space and an opening, and a cover 220 corresponding to the opening of the body 210 to define the internal space. The other elements are the same as those described above.

The material, physical properties, etc. of the heat insulating material 400 are the same as those described above.

The system may include a reaction chamber 500 in which the reactor 200 that is surrounded by the heat insulating material 400 is located. The heating device 600 may be provided outside the reaction chamber to control the temperature of the internal space of the reactor 200.

A vacuum exhauster 700 may be in communication with the reaction chamber 500 to control the degree of vacuum in the reaction chamber 500. A line 810, through which a gas is injected into the reaction chamber, may also be in communication with the reaction chamber 500. A mass flow controller 800 may be provided in the line 810 to control the gas injection. By utilizing these elements, the flow rates of an inert gas may be controlled in the growth and cooling operations.

The heating device 600 may induce a temperature difference of 40° C. to 60° C. or 50° C. to 55° C. between the upper and the lower portions of the internal space at the pre-growth onset temperature. The pre-growth onset temperature refers to a temperature at which the internal space begins to be depressurized in a state in which an inert gas is injected into the internal space and the development temperature refers to a temperature at which the growth of silicon carbide is induced after completion of the depressurization of the internal space.

The heating device 600 may create a temperature difference of 110° C. to 160° C. at the development temperature. The temperature difference may be 135° C. to 150° C.

The heating device 600 may be a helical coil disposed along the outer circumference of the reactor 200 or the heat insulating material 400 surrounding the reactor.

The depressurization operation, the heating operation, the second growth process, and the cooling operation can be carried out before or after the first growth process in the system. The recovery in the cooling operation may be performed by cutting the rear surface of the silicon carbide ingot in contact with the silicon carbide seed crystal 110.

5% or less of the entire area of the rear surface of the recovered silicon carbide ingot in contact with the silicon carbide seed crystal 110 may be lost after heating at a rate of 5° C./min from room temperature to 900° C. and oxidation heat treatment at 900° C. for 10 hours. The heat treatment may be performed in a furnace at ambient atmosphere without the need to use any gas such as oxygen or nitrogen.

Silicon Carbide Ingot

In another aspect, a silicon carbide ingot, according to an example, is provided whose rear surface in contact with a silicon carbide seed crystal 110 is lost by 5% or less or 3.2% or less of its entire area after heating at a rate of 5° C./min from room temperature to 900° C. and oxidation heat treatment at 900° C. for 10 hours. The rear surface of the silicon carbide ingot may be lost by more than 0% but not more than 0.001% of its entire area. The heat treatment may be performed in a furnace at ambient atmosphere without the need to use any gas such as oxygen or nitrogen.

The silicon carbide ingot may include 4H silicon carbide.

The silicon carbide ingot may have a diameter of 4 inches to 12 inches.

The temperature difference created in the growth operation of the method may allow the silicon carbide ingot to have improved rear surface quality and a reduced density of defects.

Method for Manufacturing Wafer

In yet another aspect, a method for manufacturing a wafer, in accordance with one or more embodiments, includes the operations of cutting the silicon carbide ingot produced by the method for producing a silicon carbide ingot into a wafer (a cutting operation) and planarizing the wafer and polishing the surface of the planarized wafer (a processing operation).

The silicon carbide ingot may be cut at an off angle with respect to the (0001) plane of the silicon carbide ingot or a plane where the silicon carbide ingot begins to grow. The off angle may be 0° to 10°.

The cutting operation may be carried out such that the thickness of the wafer is 150 μm to 900 μm or 200 μm to 600 μm. However, the thickness of the wafer is not so limited.

In the processing operation, a grinding wheel may be used to planarize both sides of the wafer, and/or remove damage caused in the cutting operation.

Particles may be embedded in the surface of the grinding wheel. The particles may be diamond particles.

The grinding wheel and the wafer may rotate in opposite directions.

The grinding wheel may have a diameter larger than a diameter of the wafer. The diameter of the grinding wheel may be not larger than 250 mm.

The method may further include the operation of wet etching the wafer after the processing operation.

The processing operation may further include the sub-operation of chemical mechanical polishing.

The chemical mechanical polishing may be performed by bringing the wafer fixed to a rotating polishing head into contact with a slurry of abrasive particles under a predetermined pressure while supplying the slurry onto a rotating platen.

The method may further include the operation of cleaning with a standard RCA chemical cleaning solution after the processing operation.

The wafer manufactured by the method may have a low density of defects, a reduced number of impurity particles, and good surface properties. The use of the wafer enables the fabrication of a device with excellent electrical or optical properties.

Example embodiments will be explained in more detail with reference to the following examples. However, these examples are merely illustrative to assist in understanding example embodiments and are not intended to limit the scope of example embodiments.

<Examples 1-3: Production of Silicon Carbide Ingots>

The system illustrated in FIG. 3 was used to produce silicon carbide ingots. First, a silicon carbide powder as a raw material 300 was loaded into the lower portion 240 of the internal space of the reactor 200, and a silicon carbide seed crystal 110 was arranged in the upper portion 230 of the internal space. In an example, the silicon carbide seed crystal 110 was composed of a 4H silicon carbide crystal having a diameter of 6 inches, and was fixed such that its C plane (000-1) was directed towards the silicon carbide raw material 300 arranged in the lower portion of the internal space.

The reactor 200 was assembled, surrounded by the heat insulating material 400, and arranged in a quartz tube 500 provided with a heating coil as external heating device 600.

As illustrated in FIG. 1, the internal space of the reactor 200 was evacuated to a vacuum, argon gas was introduced into the internal space until the internal space reached 760 torr, and the temperature in the lower portion of the internal space was raised at a rate of 7-10° C./min to the pre-growth onset temperature shown in Table 1. The internal space was depressurized and simultaneously heated at a rate of 3-5° C./min for pre-growth, and the temperatures and pressures of the upper and lower portions of the internal space were set to those shown in Table 1. After the development temperatures, the temperature differences, and the pressures shown in Table 1 were reached, a silicon carbide ingot was allowed to grow for 80-140 h while maintaining the same conditions.

After growth, the internal space was cooled to 25° C. at a rate of 5-8° C./min, and simultaneously, argon or nitrogen gas was injected such that the pressure of the internal space was 760 torr.

<Comparative Examples 1-3: Production of Silicon Carbide Ingots>

Silicon carbide ingots were produced in the same manner as in Example 1, except that the onset temperatures, the development temperatures, and the temperature differences in the first growth process were changed as shown in Table 1.

<Experimental Example 1: Evaluation of Rear Surfaces of the Silicon Carbide Ingots>

Each of the silicon carbide ingots produced in Examples 1-3 and Comparative Examples 1-3 was separated from the corresponding seed crystal by cutting. The ingot was heated at a rate of 5° C./min from room temperature to 900° C. in a furnace at ambient atmosphere, followed by oxidation heat treatment at 900° C. for 10 h. Then, the loss of the rear surface of the ingot in contact with the seed crystal was visually evaluated. When >5% of the entire area of the rear surface of the ingot was lost, the rear surface was judged to be "lost".

TABLE 1

| | Onset temperatures in the first growth process | | | Development temperatures in the first growth process | | | Variation in the temperature difference | Loss of plane of seed crystal (area %) |
|---|---|---|---|---|---|---|---|---|
| | Temperature of the lower portion | Temperature of the upper portion | Temperature difference | Temperature of the lower portion | Temperature of the upper portion | Temperature difference | | |
| Example 1 | 1620 | 1565 | 55 | 2330 | 2180 | 150 | 95 | 2.7% |
| Example 2 | 1640 | 1587 | 53 | 2330 | 2178 | 152 | 99 | 3.1% |
| Example 3 | 1600 | 1550 | 50 | 2330 | 2195 | 135 | 85 | 4.9% |
| Comparative Example 1 | 1620 | 1590 | 30 | 2330 | 2230 | 100 | 70 | Significant, 10.4% |
| Comparative Example 2 | 1580 | 1480 | 100 | 2330 | 2145 | 185 | 85 | Significant, 13.2% |
| Comparative Example 3 | 1600 | 1520 | 70 | 2330 | 2162 | 168 | 98 | Significant, 7.9% |

Temperature unit: ° C.,
Pressure unit: torr

As can be seen from the results in Table 1, the plane of the seed crystal corresponding to the rear surface of each of the ingots produced in Examples 1-3, which satisfied the requirements in terms of temperature differences: 40-60° C. at the onset temperature and 110-160° C. at the development temperature, was lost by <5% of its entire area, unlike that of each of the ingots produced in Comparative Examples 1-3, which did not satisfy the requirements in terms of temperature differences.

Figure 2A:
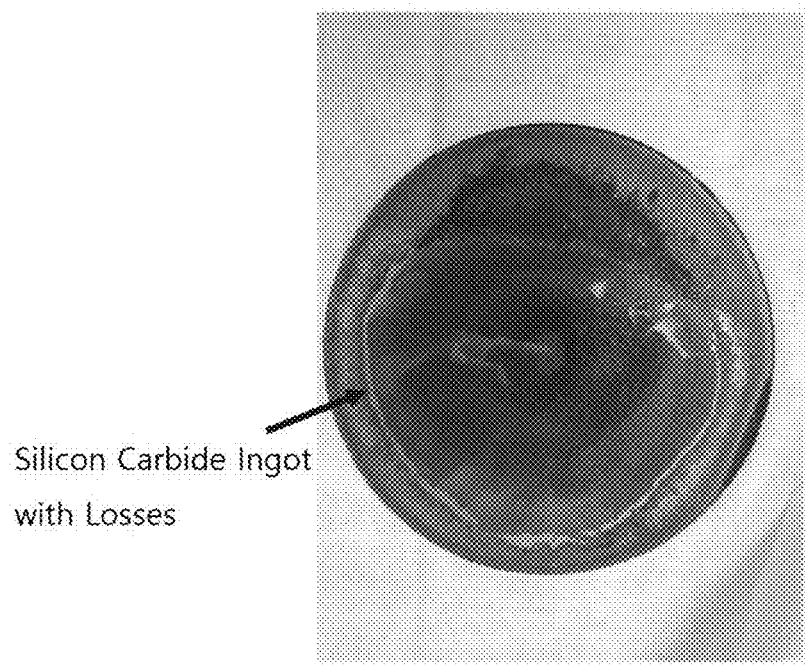
FIGS. 2A and 2B illustrate images of the rear surfaces of silicon carbide ingots having undergone losses.
Figure 2B:
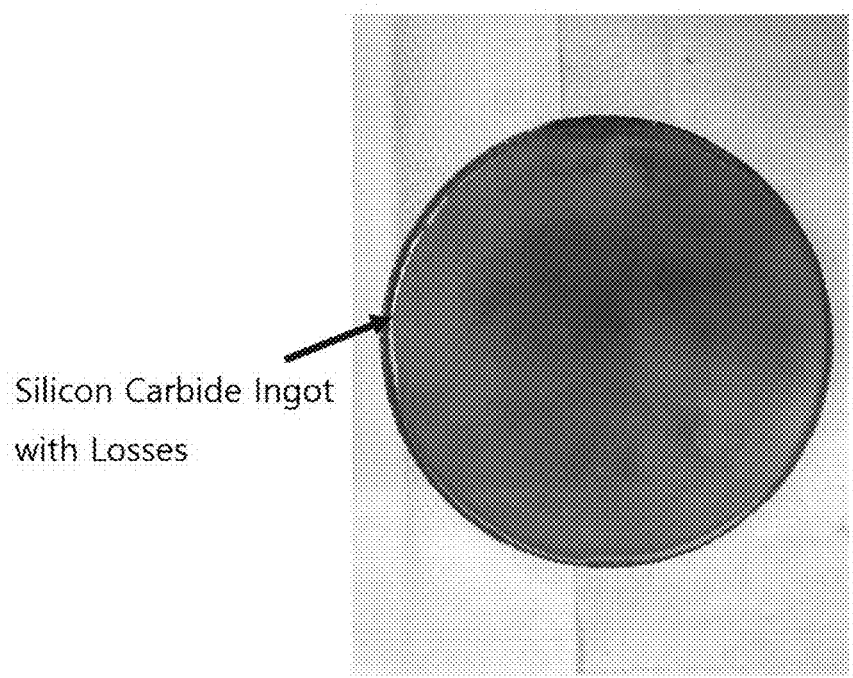
Figure 2C:
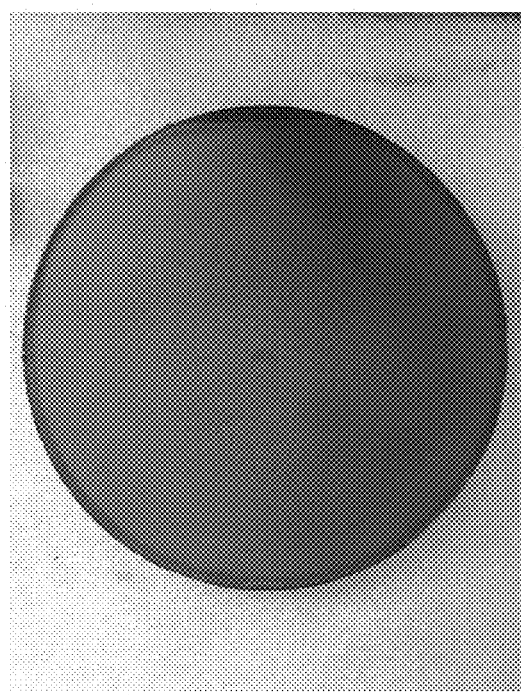
FIG. 2C illustrates an image of the rear surface of a silicon carbide ingot with no substantial loss, in accordance with one or more embodiments.

As shown in FIG. 2C, no substantial loss was observed in the plane of the seed crystal corresponding to the rear surface of the ingot produced in Example 1. In contrast, as shown in FIGS. 2A and 2B, significant losses were observed for the ingots of Comparative Examples 2 and 3, respectively.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A silicon carbide ingot producing method, the method comprising:
    arranging a raw material and a silicon carbide seed crystal to face each other in a reactor having an internal space;
    depressurizing the internal space in an atmosphere;
    injecting an inert gas into the depressurized internal space, followed by performing a heating operation to the pre-growth onset temperature, prior to the growth operation
    performing a growth operation by controlling a temperature, a pressure, and the atmosphere of the internal space to sublimate the raw material, and grow a silicon carbide ingot from the silicon carbide seed crystal; and
    cooling the reactor, and recovering the silicon carbide ingot,
    wherein a heat insulating material surrounds an outer surface of the reactor, a heating device is configured to control the temperature of the internal space;
    wherein the growth operation comprises a first growth process in which the temperature of the internal space increases from a pre-growth onset temperature to a development temperature, and a second growth process in which the development temperature is maintained to produce the silicon carbide ingot,
    wherein the internal space is depressurized at the pre-growth onset temperature, the growth of the silicon carbide ingot is induced at the development temperature after completion of the depressurization of the internal space, a difference in temperature between an upper portion and a lower portion of the internal space at the pre-growth onset temperature is 40° C. to 60° C., the silicon carbide seed crystal is located in the upper portion of the internal space, and the raw material is located in the lower portion of the internal space, and
    wherein a heating rate in the first growth process is lower than an average heating rate throughout the heating operation and the first growth process.

2. The method of claim 1, wherein the heating device is configured to move in an upward direction and a downward direction from the reactor, and induce a difference in temperature between the upper portion and the lower portion of the internal space in the growth operation.

3. The method of claim 1, wherein the pre-growth onset temperature in the lower portion of the internal space is 1500° C. to 1700° C.

4. The method of claim 1, wherein the development temperature in the lower portion of the internal space in the growth step is 2100° C. to 2500° C.

5. The method of claim 1, wherein a temperature difference at the development temperature is greater by 70° C. to 120° C. than a temperature difference at the pre-growth onset temperature.

6. The method of claim 1, wherein a temperature difference at the development temperature in the first growth process is 110° C. to 160° C.

7. The method of claim 1, wherein the internal space is depressurized to 1 torr to 50 torr in the first growth process.

8. The method of claim 1, wherein the silicon carbide seed crystal comprises 4H silicon carbide of 4 inches or more.

9. The method of claim 1, wherein a heating rate in the first growth process is 1° C./min to 5° C./min.

10. A silicon carbide ingot producing method, the method comprising:
    arranging a raw material and a silicon carbide seed crystal to face each other in a reactor having an internal space;
    performing a growth operation by controlling a temperature, a pressure, and an atmosphere of the internal space to sublimate the raw material, and grow a silicon carbide ingot from the silicon carbide seed crystal; and
    cooling the reactor, and recovering the silicon carbide ingot,
    wherein a heat insulating material surrounds an outer surface of the reactor, a heating device is configured to control the temperature of the internal space;
    wherein the growth operation comprises a first growth process in which the temperature of the internal space increases from a pre-growth onset temperature to a development temperature, and a second growth process in which the development temperature is maintained to produce the silicon carbide ingot,
    wherein the internal space is depressurized at the pre-growth onset temperature, the growth of the silicon carbide ingot is induced at the development temperature after completion of the depressurization of the internal space, a difference in temperature between an upper portion and a lower portion of the internal space at the pre-growth onset temperature is 40° C. to 60° C., the silicon carbide seed crystal is located in the upper portion of the internal space, and the raw material is located in the lower portion of the internal space,
    wherein a recovery in the cooling operation is performed by cutting a rear surface of the silicon carbide ingot in contact with the silicon carbide seed crystal, and 5% or less of the entire area of the rear surface of the recovered silicon carbide ingot is lost after heating at a rate of 5° C./min from room temperature to 900° C. and oxidation heat treatment at 900° C. for 10 hours.

11. A silicon carbide ingot producing system, comprising:
    a reactor having an internal space;
    a heat insulating material surrounding an outer surface of the reactor; and a heating device configured to control a temperature of the internal space, wherein a silicon carbide seed crystal is located in an upper portion of the internal space, a raw material is located in a lower portion of the internal space;

wherein the heating device is configured to move in an upward direction and a downward direction from the reactor to control a difference in temperature between the upper portion of the internal space and the lower portion of the internal space, wherein the internal space is depressurized at a pre-growth onset temperature, a growth of the silicon carbide ingot is induced at a development temperature after completion of a depressurization of the internal space, and a difference in temperature between the upper portion of the internal space and the lower portion of the internal space induced by the heating device is 40° C. to 60° C. at the pre-growth onset temperature, and wherein 5% or less of the entire area of a rear surface of the silicon carbide ingot which was in contact with the silicon carbide seed crystal is lost after heating at a rate of 5° C./min from room temperature to 900° C. and oxidation heat treatment at 900° C. for 10 hours.

* * * * *